US007916876B1

(12) United States Patent
Helsloot et al.

(10) Patent No.: US 7,916,876 B1
(45) Date of Patent: Mar. 29, 2011

(54) SYSTEM AND METHOD FOR RECONSTRUCTING HIGH FREQUENCY COMPONENTS IN UPSAMPLED AUDIO SIGNALS USING MODULATION AND ALIASING TECHNIQUES

(75) Inventors: Michiel André Helsloot, 's-Hertogenbosch (NL); Erwin Zan Pieter Van Der Stelt, Sleeuwijk (NL); Dennis Johannes Lex, Nieuwendijk (NL)

(73) Assignee: SiTel Semiconductor B.V. (NL)

( * ) Notice: Subject to any disclaimer, the term of this patent is extended or adjusted under 35 U.S.C. 154(b) by 1107 days.

(21) Appl. No.: 10/880,822

(22) Filed: Jun. 30, 2004

Related U.S. Application Data

(60) Provisional application No. 60/483,750, filed on Jun. 30, 2003.

(51) Int. Cl.
*H03G 3/00* (2006.01)

(52) U.S. Cl. ................ 381/61; 381/98; 700/94; 84/622; 84/624; 84/694

(58) Field of Classification Search .................... 381/61, 381/98, 97, 98.61; 700/94; 704/205, 209, 704/219, 211; 84/622, 624–625, 694; 455/59–61
See application file for complete search history.

(56) References Cited

U.S. PATENT DOCUMENTS

| | | | | |
|---|---|---|---|---|
| 6,335,973 | B1 * | 1/2002 | Case | 381/61 |
| 6,792,119 | B1 * | 9/2004 | Aarts | 381/98 |
| 6,829,360 | B1 * | 12/2004 | Iwata et al. | 381/61 |
| 6,865,430 | B1 * | 3/2005 | Runton et al. | 700/94 |
| 7,236,839 | B2 * | 6/2007 | Fujita et al. | 700/94 |
| 7,577,269 | B2 * | 8/2009 | Adelman | 381/417 |
| 2001/0036285 | A1 * | 11/2001 | Aarts et al. | 381/100 |
| 2003/0044023 | A1 * | 3/2003 | Larsen | 381/61 |
| 2003/0158729 | A1 * | 8/2003 | Royle et al. | 704/211 |
| 2004/0028244 | A1 * | 2/2004 | Tsushima et al. | 381/98 |

* cited by examiner

*Primary Examiner* — Devona E Faulk
*Assistant Examiner* — Disler Paul

(57) ABSTRACT

A system and method is disclosed for reconstructing high frequency components of a digital audio signal using a harmonic enhancer in a baseband integrated circuit of a receiver handset. The original spectrum of the digital audio signal is upsampled in a times two (2) upsample unit to double the size of the bandwidth. A low pass filter then removes a high frequency alias of the original spectrum. The spectrum is then modulated with a first carrier frequency and sent to a first filter bank where a low pass filter and a high pass filter shape the modulated harmonic spectrum. After gain adjustment, the modulated harmonic spectrum is added to a delayed version of the original spectrum. Additional harmonic spectra are similarly created at other carrier frequencies and added to the audio output spectra to reconstruct high frequency components of the audio signal.

20 Claims, 8 Drawing Sheets

SYSTEM AND METHOD FOR RECONSTRUCTING HIGH FREQUENCY COMPONENTS IN UPSAMPLED AUDIO SIGNALS USING MODULATION AND ALIASING TECHNIQUES

REFERENCE TO PROVISIONAL PATENT APPLICATION

This patent application claims priority to U.S. Provisional Patent Application No. 60/483,750 that was filed on Jun. 30, 2003.

TECHNICAL FIELD OF THE INVENTION

The present invention is generally directed to digital communications technology and, in particular, to a system and method for providing artificial signal enhancement to digital audio signals in digital communication devices.

BACKGROUND OF THE INVENTION

There is a demand for techniques to improve the quality of telephone audio. The quality of telephone audio is also referred to as voice quality or audio quality. The major limitation in increasing audio quality is the size of the telephone spectrum bandwidth. The telephone spectrum bandwidth ranges from three hundred Hertz (300 Hz) to three thousand four hundred Hertz (3,400 Hz). Because the transmission bandwidth is fixed in size, it is not possible to transmit better quality audio signals.

Instead, a technique must be developed that artificially improves the audio quality after the audio signal has been received in a handset but before the audio signal is sent through the speaker of the handset. That is, the enhancement of the audio signal can take place only in a receiving handset.

There is a need in the art for a system and method for creating an audio signal that has an enhanced audio quality. There is a need in the art for a system and method for enhancing an audio signal after the audio signal has been received in a receiver of a handset but before the audio signal is sent to a speaker of the handset.

SUMMARY OF THE INVENTION

To address the above-discussed deficiencies of the prior art, it is a primary object of the present invention to provide a system and method for enhancing the voice quality of a digital audio signal in a receiving handset.

The present invention enhances a digital audio signal in a receiving handset by upsampling the audio signal to expand the audio bandwidth of the received audio signal. Then one or more additional signals are added to the audio signal. The additional signals have higher frequencies than the original audio signal. The addition of the higher frequency additional signals is done using harmonic modulation and aliasing techniques.

In particular, the present invention improves speech quality by extending the telephone frequency band (three hundred Hertz (300 Hz) to three thousand four hundred Hertz (3,400 Hz)) to a frequency band of ten Hertz (10 Hz) to eight thousand Hertz (8,000 Hz). This is done by the controlled addition of audio signals in frequency bands that are normally filtered out and therefore not sent. The frequency range of the frequency bands that are normally filtered out is from approximately three thousand four hundred Hertz (3,400 Hz) to approximately ten thousand Hertz (10,000 Hz).

The system and method of the present invention reconstructs the high frequency components of the digital audio signal using a harmonic enhancer in a baseband integrated circuit of the receiver handset. The original spectrum of the digital audio signal is upsampled in a times N upsample unit (where N is greater than or equal to two (2)) to double the size of the bandwidth. A low pass filter then removes a high frequency alias of the original spectrum. The spectrum is then modulated with a first carrier frequency and sent to a first filter bank where a low pass filter and a high pass filter shape the modulated harmonic spectrum. After gain adjustment, the modulated harmonic spectrum is added to a delayed version of the original spectrum. Additional harmonic spectra are similarly created at other carrier frequencies and added to the audio output spectra to reconstruct high frequency components of the digital audio signal.

It is an object of the present invention to provide a system and method for enhancing the voice quality of a digital audio signal in a receiving handset.

It is also an object of the present invention to provide a system and method for enhancing a digital audio signal after the digital audio signal has been received in a receiver of a handset but before the digital audio signal is sent to a speaker of the handset.

It is yet another object of the present invention to provide a system and method for upsampling a digital audio signal to expand the audio bandwidth of the audio signal.

It is still another object of the present invention to provide a system and method for creating one or more harmonic spectra and adding the harmonic spectra to the audio output spectra of the digital audio signal to reconstruct high frequency components of the digital audio signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 15, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged digital audio system.

Figure 1:
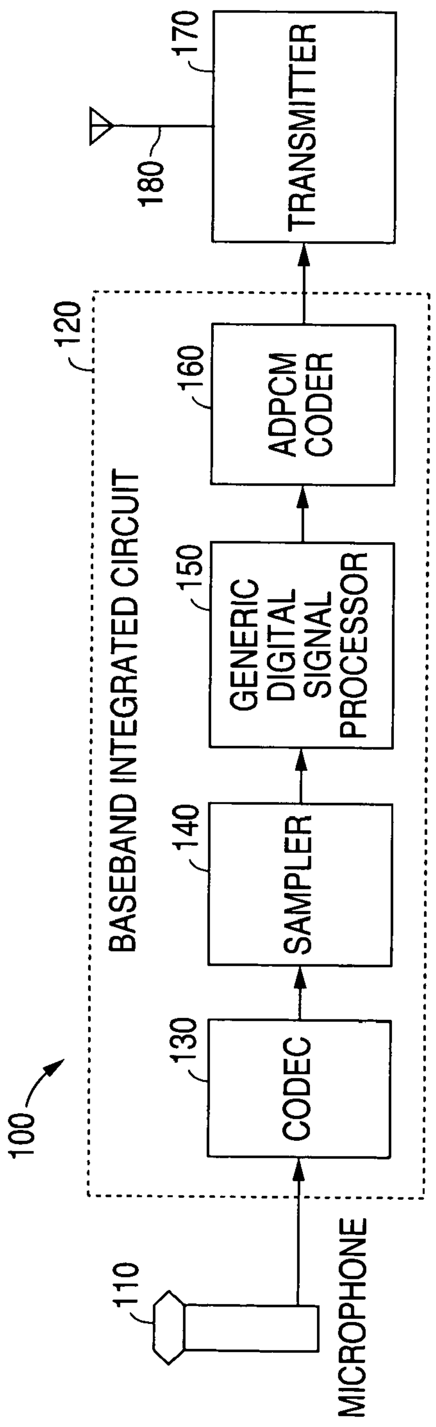
FIG. 1 (PRIOR ART)
FIG. 1 illustrates a prior art baseband integrated circuit that is capable of converting an analog audio signal to a digital audio signal for transmission to a remotely located receiver.

FIG. 1 illustrates a prior art circuit 100 that is capable of converting an analog audio signal to a digital audio signal and wirelessly transmitting the digital audio signal to a remotely located receiver. Prior art circuit 100 generally comprises a microphone 110, a baseband integrated circuit 120, a transmitter 170, and an antenna 180. The baseband integrated circuit 120 comprises a codec 130, a sampler 140, a generic digital signal processor 150, and an Adaptive Differential Pulse Code Modulation (ADPCM) coder 160. An example of baseband integrated circuit 120 is the SC14428 baseband integrated circuit chip manufactured by National Semiconductor Corporation.

An analog audio signal from microphone 110 is received by codec 130. Codec 130 is responsible for the initial audio filtering. Codec 130 filters the analog audio signal from three hundred Hertz (300 Hz) up to and including three thousand four hundred Hertz (3400 Hz). Then the filtered signal is sent to sampler 140. Sampler 140 then samples the signal on eight kilohertz (8 kHz). The digitized signal then proceeds to the generic digital signal processor (GenDSP) 150. Several different signal processes may be carried out with the digital audio signal in GenDSP 150 before the digital audio signal is sent to the ADPCM coder 160.

After the digital audio signal processing in GenDSP 150 has been completed, the digital audio signal is sent to the ADPCM coder 160. ADPCM coder 160 codes the digital audio signal and sends it to transmitter 170 for transmission through antenna 180.

Figure 2:
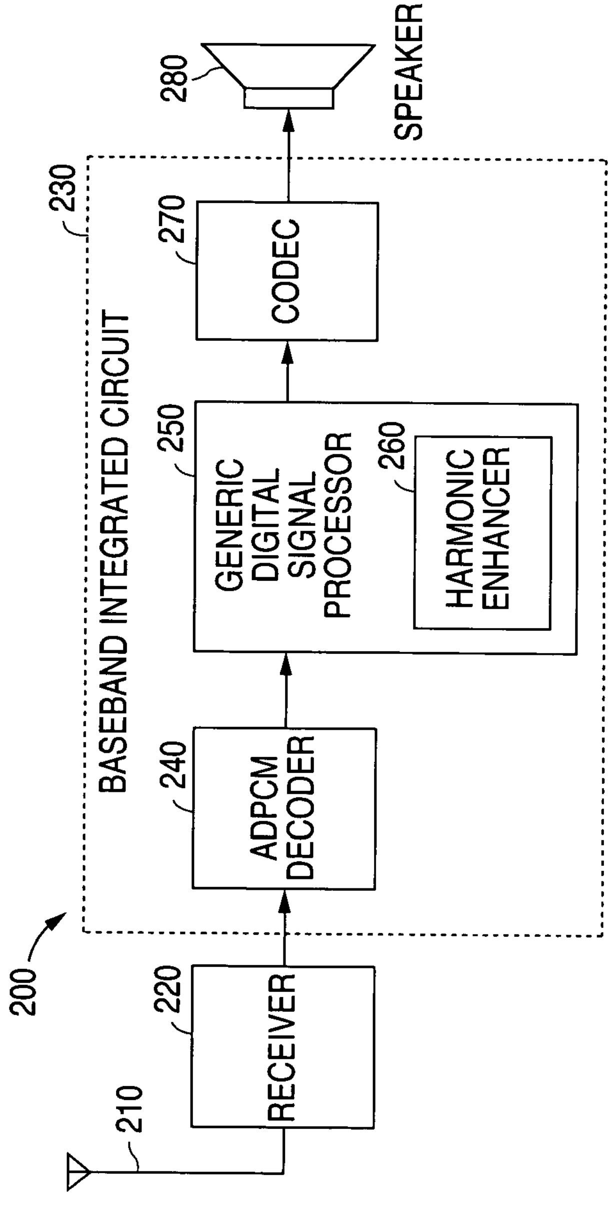
FIG. 2 illustrates a baseband integrated circuit that is capable of receiving a transmitted digital audio signal and converting the digital audio signal to an analog audio signal using harmonic enhancement techniques in accordance with the principles of the present invention.

FIG. 2 illustrates a receiving system 200 that comprises a baseband integrated circuit 230 that is capable of receiving the transmitted digital audio signal and converting the digital audio signal to an analog audio signal using harmonic enhancement techniques in accordance with the principles of the present invention. Baseband integrated circuit 230 comprises an ADPCM decoder 240, a generic digital signal processor (GenDSP) 250, a harmonic enhancer 260, and a codec 270.

The digital audio signal from antenna 180 of transmitter 170 of FIG. 1 is received through antenna 210 of receiver 220 of FIG. 2. The received signal is first decoded in the ADPCM decoder 240. The decoded signal is then sent to GenDSP 250 for further signal processing. GenDSP 250 comprises harmonic enhancer 260 of the present invention. The structure and operation of harmonic enhancer 260 will be described more fully below.

After the digital audio signal has been processed by GenDSP 250, the digital audio signal is sent to codec 270 to be filtered and converted to an analog signal. Codec 270 has a sample frequency of sixteen kiloHertz (16 kHz) and a bandwidth of eight kiloHertz (8 kHz). Then the resulting analog audio signal is sent to speaker 280 and broadcast through speaker 280.

Figure 3:
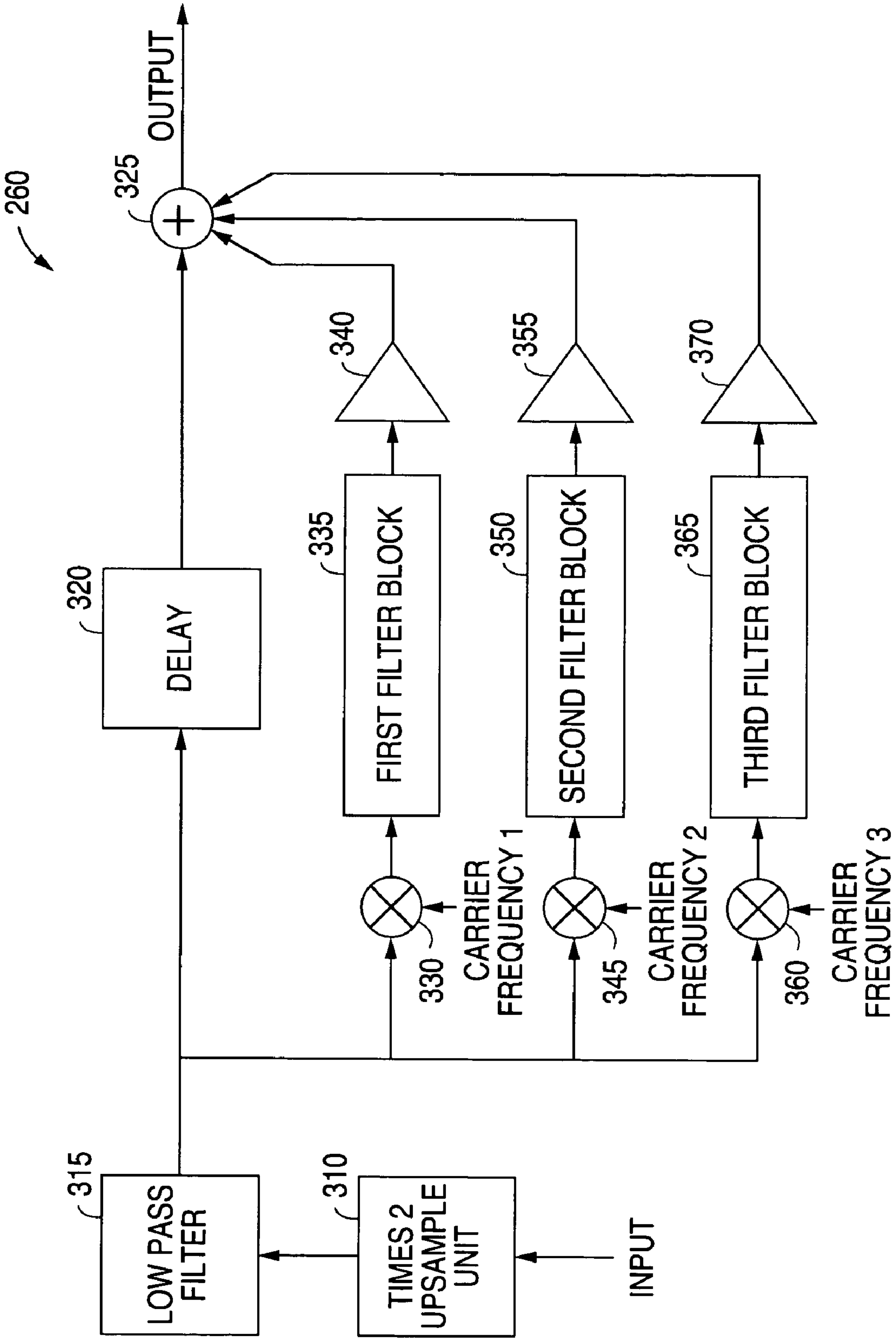
FIG. 3 illustrates a block diagram of an advantageous embodiment of a harmonic enhancer of the present invention.

FIG. 3 illustrates a block diagram of an advantageous embodiment of harmonic enhancer 260 of the present invention. Harmonic enhancer 260 comprises a times two (2) upsample unit 310, low pass filter 315, delay unit 320, adder 325, modulators (330, 345 and 360), a first filter block 335, a second filter block 350, a third filter block 365, and gain units (340, 355, 370).

The function of the harmonic enhancer 260 is to "add" additional sound to the original audio spectrum in order to improve the quality of voice communications. In the advantageous embodiment of the harmonic enhancer 260 shown in FIG. 3 there are three branches. The first branch comprises modulator 330, first filter block 335 and gain unit 340. The second branch comprises modulator 345, second filter block 350 and gain unit 355. The third branch comprises modulator 360, third filter block 365 and gain unit 370. It is understood that the use of three branches is an example and that the harmonic enhancer of the present invention is not limited to exactly three branches. Specifically, the harmonic enhancer may have more than three branches or fewer than three branches. As will be more fully explained, the three branches use their respective carrier frequencies to create the additional sounds that are to be added to the audio spectrum.

The original audio spectrum has a sample rate of eight kilohertz (8 kHz). This means that after four kilohertz (4 kHz) no audio will be present. To be more precise, the audio spectrum runs from three hundred Hertz (300 Hz) to three thousand four hundred Hertz (3400 Hz). To obtain a bandwidth of eight kilohertz (8 kHz) the bandwidth must be doubled. The bandwidth may be doubled by upsampling.

Figure 4:
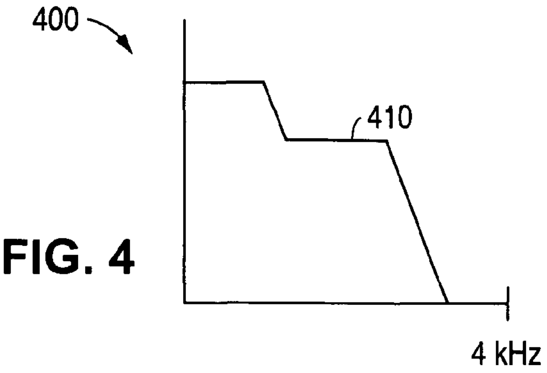
FIG. 4 illustrates an exemplary original digital audio spectrum for input into a times two (2) upsample unit of the harmonic enhancer of the present invention.

For example, consider the exemplary original digital audio spectrum 410 shown in FIG. 4 as the input to harmonic enhancer 260. FIG. 4 illustrates a graph 400 of the magnitude of the input signal 410 versus frequency. The input to the harmonic enhancer 260 is normally the signal that would be supplied to codec 270 if the harmonic enhancer 260 were not present within GenDSP 250. The input signal 410 is first provided to the times two (2) upsample unit 310. The times two (2) upsample unit 310 doubles the bandwidth of the audio spectrum by upsampling. The structure and operation of the times two (2) upsample unit 310 is well known in the art and will not be described here.

Figure 5:
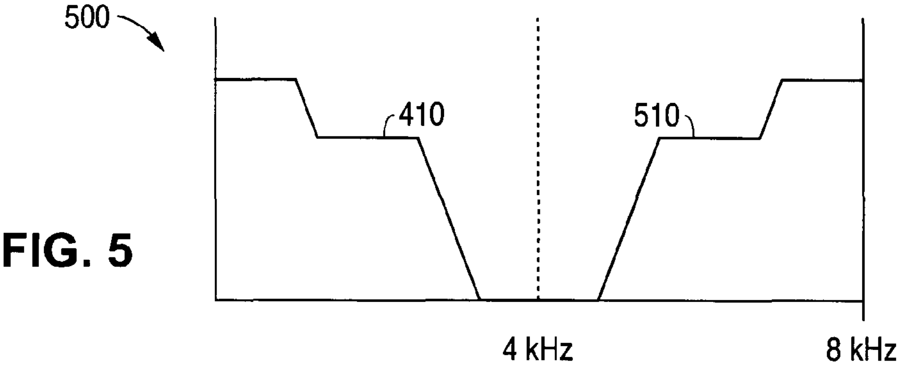
FIG. 5 illustrates an exemplary digital audio spectrum that represents the output of the times two (2) upsample unit of the harmonic enhancer of the present invention for the input spectrum shown in FIG. 4 showing an alias of the original input spectrum.

FIG. 5 illustrates an exemplary digital audio spectrum that represents the output of the times two (2) upsample unit of the harmonic enhancer 260 for the input spectrum 410 shown in FIG. 4. The upsampling operation causes an alias of the original spectrum around the Nyquist frequency (four kilohertz (4 kHz)) as shown in FIG. 5. That is, FIG. 5 illustrates a graph 500 of the magnitude of the input signal 410 versus frequency and the alias 510 of the input signal versus frequency. As seen in FIG. 5, the bandwidth has been doubled up to eight kilohertz (8 kHz).

Figure 6:
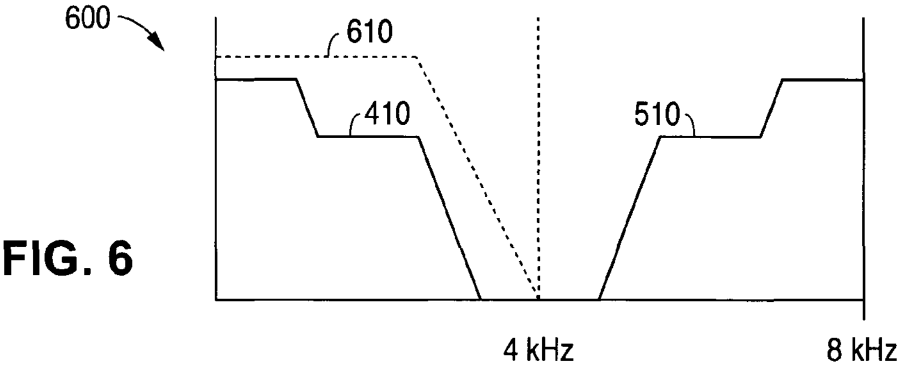
FIG. 6 illustrates the effect of a low pass filter on the exemplary output spectrum shown in FIG. 5 to illustrate how the alias of the spectrum may be filtered away by the low pass filter to leave the original input spectrum and a double size bandwidth.
Figure 6A:
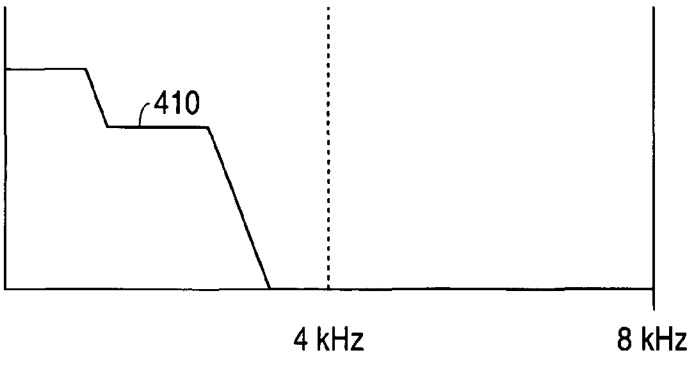
FIG. 6A illustrates the result of low pass filtering the spectrum shown in FIG. 6.

The digital audio signal is then passed out through low pass filter 315. Low pass filter 315 filters out the unwanted alias 510 of the spectrum because the alias 510 has a mirrored spectrum. The graph 600 of FIG. 6 illustrates the filter characteristic 610 of the low pass filter 315. The filter characteristic 610 of low pass filter 315 preserves the low frequency portion 410 of the audio spectrum and filters out the high frequency alias 510 of the audio spectrum. Removing the high frequency alias 510 leaves the original audio spectrum 410 in a bandwidth that has now doubled to eight kiloHertz (8 kHz). The resulting spectrum is shown in FIG. 6A.

Then the output of low pass filter 315 is provided to the input of delay unit 320, to the input of modulator 330, to the input of modulator 345, and to input of modulator 360. The delay unit 320 delays the original spectrum 410 by a fixed time in order to compensate for the group delay of the filter blocks in the three branches to create the additional audio spectra to be added back to the original spectrum 410.

Consider the operation of the first branch that comprises modulator 330, first filter block 335 and gain unit 340. Modulator 330 modulates the original spectrum 410 with a first carrier frequency (i.e., carrier frequency 1 of FIG. 3). In the present example, the first carrier frequency is chosen to be two kiloHertz (2 kHz).

The principle of modulation is that the original image will be moved forward by the amount $f_1+f_2$. In addition, the original image is mirrored and will be appear at $f_1-f_2$. The frequency $f_1$ is the starting frequency of the original spectrum. The frequency $f_2$ is the frequency that is used to multiply with.

Figure 7:
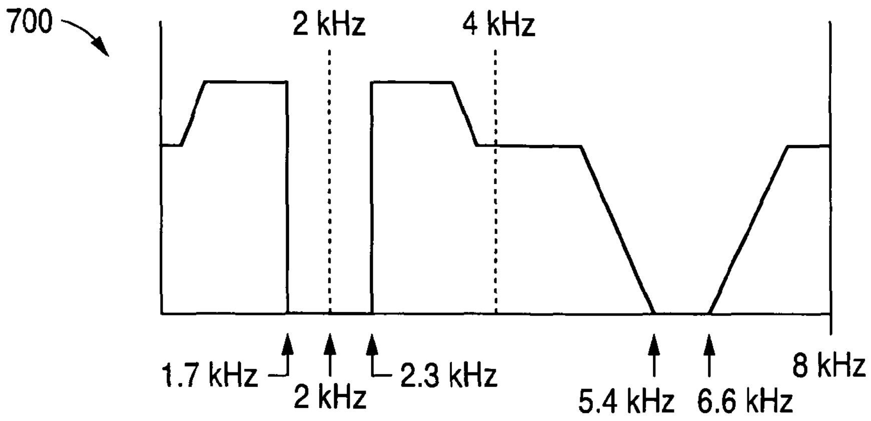
FIG. 7 illustrates the effect of modulating the original input spectrum at an exemplary modulation frequency of two kilohertz.

Modulator 330 multiplies the original spectrum 410 by a sine wave having the fixed frequency of two kiloHertz (2 kHz). FIG. 7 illustrates a graph 700 showing the magnitude of the modulated audio spectrum versus frequency. The graph 700 of FIG. 7 shows the effect of modulating the original spectrum 410 at the modulation frequency of two kilohertz (2 kHz).

The modulator 330 then provides the modulated audio spectrum to first filter block 335. First filter block 335 removes the unwanted frequencies from the modulated audio spectrum. First filter block 335 comprises a low pass filter (not shown in FIG. 3) and a high pass filter (not shown in FIG. 3).

Figure 8:
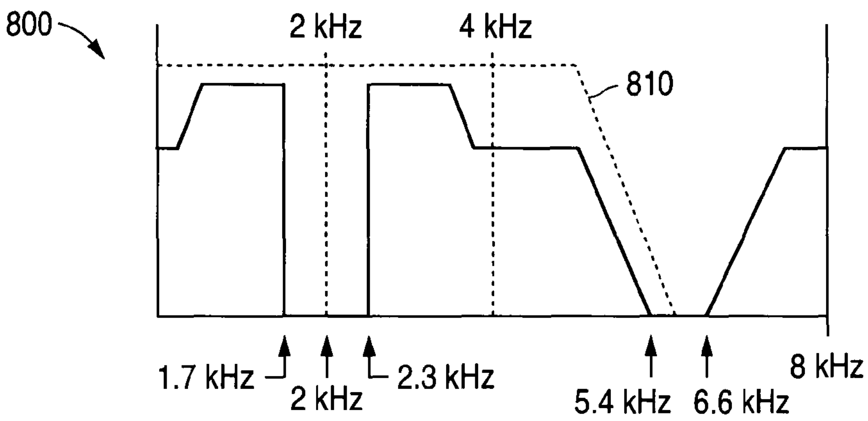
FIG. 8 illustrates the effect of a low pass filter of a filter block on the spectrum shown in FIG. 7 to illustrate how the higher frequencies of the spectrum may be filtered away by the low pass filter of the filter block.
Figure 9:
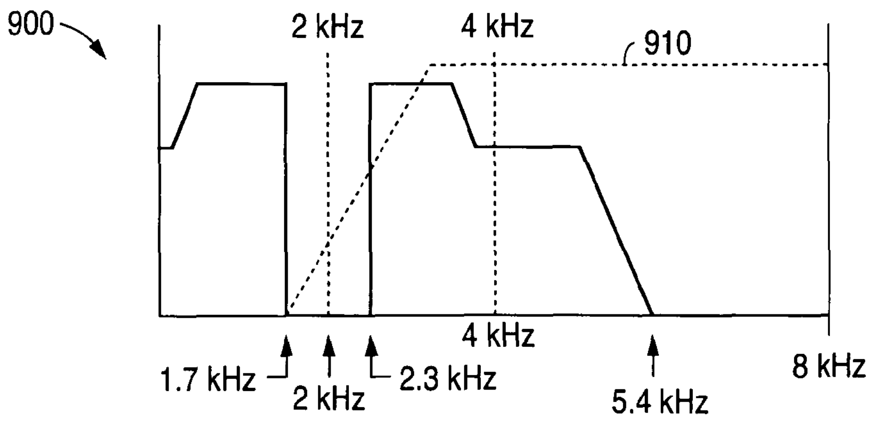
FIG. 9 illustrates the effect of a high pass filter of a filter block on the spectrum shown in FIG. 8 to illustrate how the lower frequencies of the spectrum may be filtered away by the high pass filter of the filter block.

The low pass filter of first filter block 335 filters out the high frequency portion of the modulated spectrum. The graph 800 of FIG. 8 illustrates the filter characteristic 810 of the low pass filter. The filter characteristic 810 of the low pass filter preserves the low frequency portion of the modulated spectrum. The filter characteristic 810 filters out the high frequency portion of the modulated spectrum of the alias. Removing the high frequency portion of the modulated spectrum leaves the low frequency modulated spectrum as shown in FIG. 9.

Then the high pass filter of first filter block 335 filters out the low frequency portion of the modulated spectrum. The graph 900 of FIG. 9 illustrates the filter characteristic 910 of the high pass filter. The filter characteristic 910 of the high pass filter preserves the high frequency portion of the modulated spectrum. The filter characteristic 910 filters out the low frequency portion of the modulated spectrum below approximately two thousand Hertz (2.0 kHz). Removing the low frequency portion of the modulated spectrum leaves the frequency modulated spectrum with the shape 1010 shown in FIG. 10.

Figure 10:
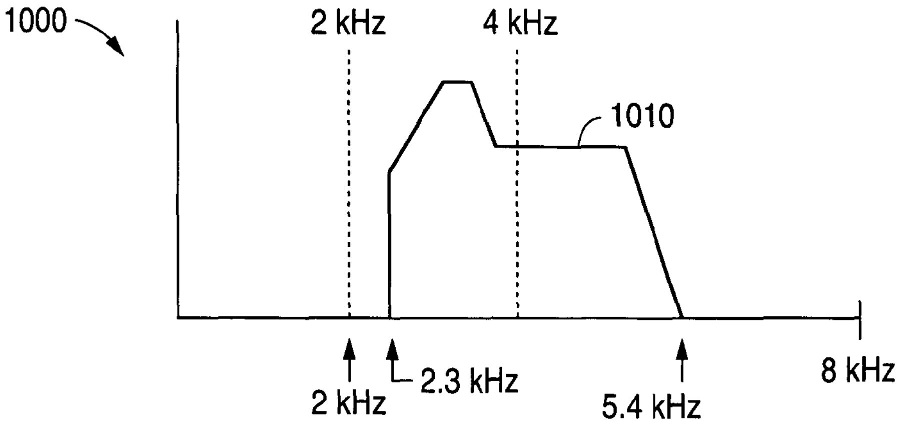
FIG. 10 illustrates the effect of applying both a low pass filter and a high pass filter of a filter block to the modulated spectrum shown in FIG. 7.
Figure 11:
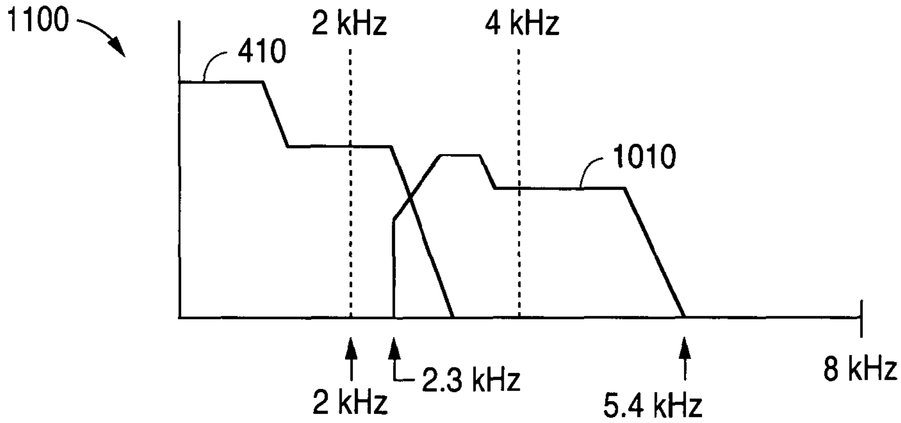
FIG. 11 illustrates the addition of an attenuated version of the spectrum shown in FIG. 10 to the original input spectrum shown in FIG. 4.

FIG. 10 illustrates a graph 1000 that shows the effect of applying both the low pass filter and the high pass filter of first filter block 335 to the modulated spectrum shown in FIG. 7. The filtered modulated spectrum 1010 is then sent through gain unit 340. Gain unit 340 attenuates the spectrum 1010 slightly and then sends the attenuated spectrum 1010 to adder 325. Adder 325 adds the attenuated version of spectrum 1010 to the original spectrum 410 from delay unit 320. FIG. 11 illustrates a graph 1100 that shows the result of adding the attenuated version of spectrum 1010 to the original input spectrum 410. The combined spectrum (410 and 1010) now reaches up to approximately five thousand four hundred kiloHertz (5.4 kHz).

In the example above the gain unit 340 was set to attenuate the filtered modulated spectrum 1010. In alternate advantageous embodiments of the invention the gain unit 340 could be used to amplify the filtered modulated spectrum 1010. That is, the gain unit 340 may be used to increase or decrease the magnitude of the filtered modulated spectrum 1010.

The other two branches of harmonic enhancer 260 operate in the same fashion. In the second branch that comprises modulator 345, second filter block 350 and gain unit 355, modulator 345 modulates the original spectrum 410 with a second carrier frequency (i.e., carrier frequency 2 of FIG. 3). The second carrier frequency in this example is larger than the first carrier frequency. The second branch adds an additional filtered modulated spectrum 1210 as shown in FIG. 12.

In the third branch that comprises modulator 360, third filter block 365 and gain unit 370, modulator 360 modulates the original spectrum 410 with a third carrier frequency (i.e., carrier frequency 3 of FIG. 3). The third carrier frequency in this example is larger than the second carrier frequency. The third branch adds an additional filtered modulated spectrum 1220 as shown in FIG. 12.

Figure 12:
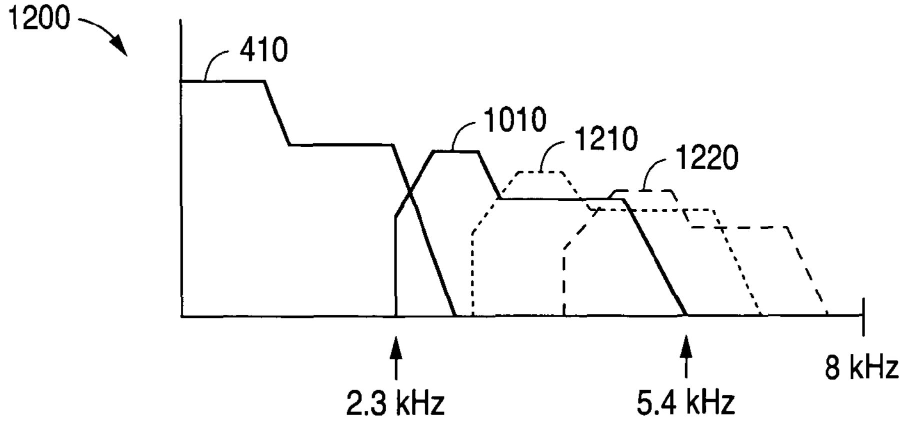
FIG. 12 illustrates the addition of two additional similarly modulated spectra to the spectrum shown in FIG. 11.

The graph 1200 of FIG. 12 shows the resulting composite of the original spectrum 410, the first filtered modulated spectrum 1010 from the first branch (the first alias), the second filtered modulated spectrum 1210 from the second branch (the second alias), and the third filtered modulated spectrum from the third branch (the third alias). As previously mentioned, the harmonic enhancer 260 of the present invention may have more than three branches or fewer than three branches.

Figure 13:
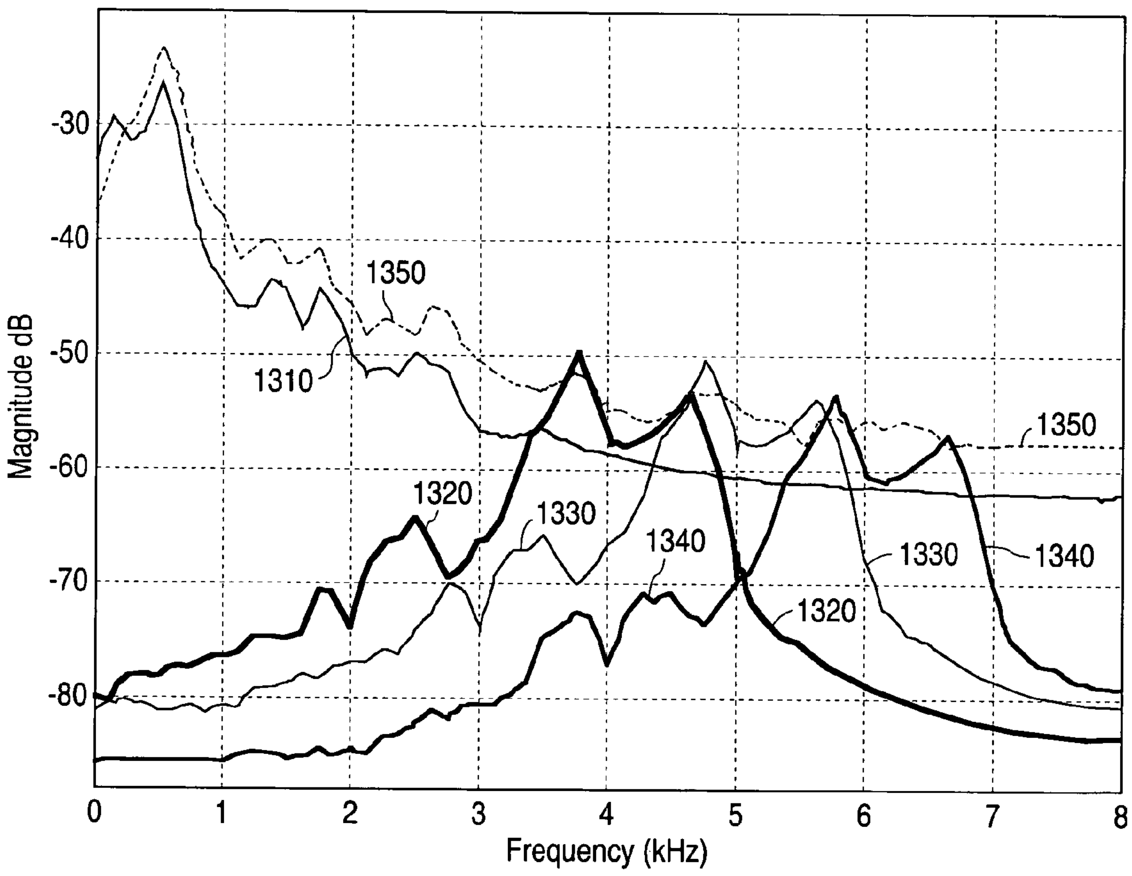
FIG. 13 illustrates a graph of signal magnitude (in decibels) versus frequency (in kiloHertz) for the audio spectrum of the audio signal showing the effect of applying harmonic enhancement to the original audio signal.

FIG. 13 illustrates a graph of signal magnitude (in decibels) versus frequency (in kiloHertz) for the audio spectrum of the audio signal showing the effect of applying harmonic enhancement to the original audio signal. Line 1310 represents the audio spectrum for the original audio signal 410 after upsampling and low pass filtering. FIG. 13 shows that line 1310 is substantially flat for the frequencies above three thousand four hundred Hertz (3,400 Hz).

Line 1320 represents the audio spectrum for the filtered modulated spectrum 1010 (the first alias). Line 1330 represents the audio spectrum for the filtered modulated spectrum 1210 (the second alias). Line 1340 represents the audio spectrum for the filtered modulated spectrum 1220 (the third alias). Line 1350 represents the final audio spectrum that results when the three harmonic spectra are added to the original audio signal 1310.

It is clear that the three added harmonic spectra have to be significantly weaker than the original audio signal 1310. To obtain an appropriate final audio spectrum 1350 the frequency response of the speaker 280 must be known and taken into account in setting the gain of the added audio spectra. For example, if an added audio spectrum has to be twenty decibels (20 dB) less than the original audio signal 1310 at a frequency of four kiloHertz (4 kHz), and if the frequency response of the speaker 280 shows an increase of twelve decibels (12 dB) at the same frequency of four kiloHertz (4 kHz), then the gain of the added audio spectrum should be a negative thirty two decibels (−32 dB).

As shown in FIG. 13, the peak at the front of each of the added harmonic spectra (1320, 1330, 1340) is much weaker than the corresponding peak was in the original audio spectrum (1310). This is done to prevent resonant effects.

In each of the filter blocks (335, 350, 365) a combination of a high pass filter and a low pass filter was used instead of a band pass filter. This structure was selected so that the cutoff frequencies overlap. Overlapping the cutoff frequencies minimizes the number of taps required in the filters. By shifting the high pass filter of the filter block more to the left, the peak at the front of the spectrum may be reduced in order to limit the resonant effect.

It is understood, however, that the harmonic enhancer of the invention is not limited to using a separate high pass filter and a separate low pass filter in the filter blocks. In an alternate embodiment of the invention the high pass filter and the low pass filter of each filter block may be replaced with a band pass filter.

Figure 14:
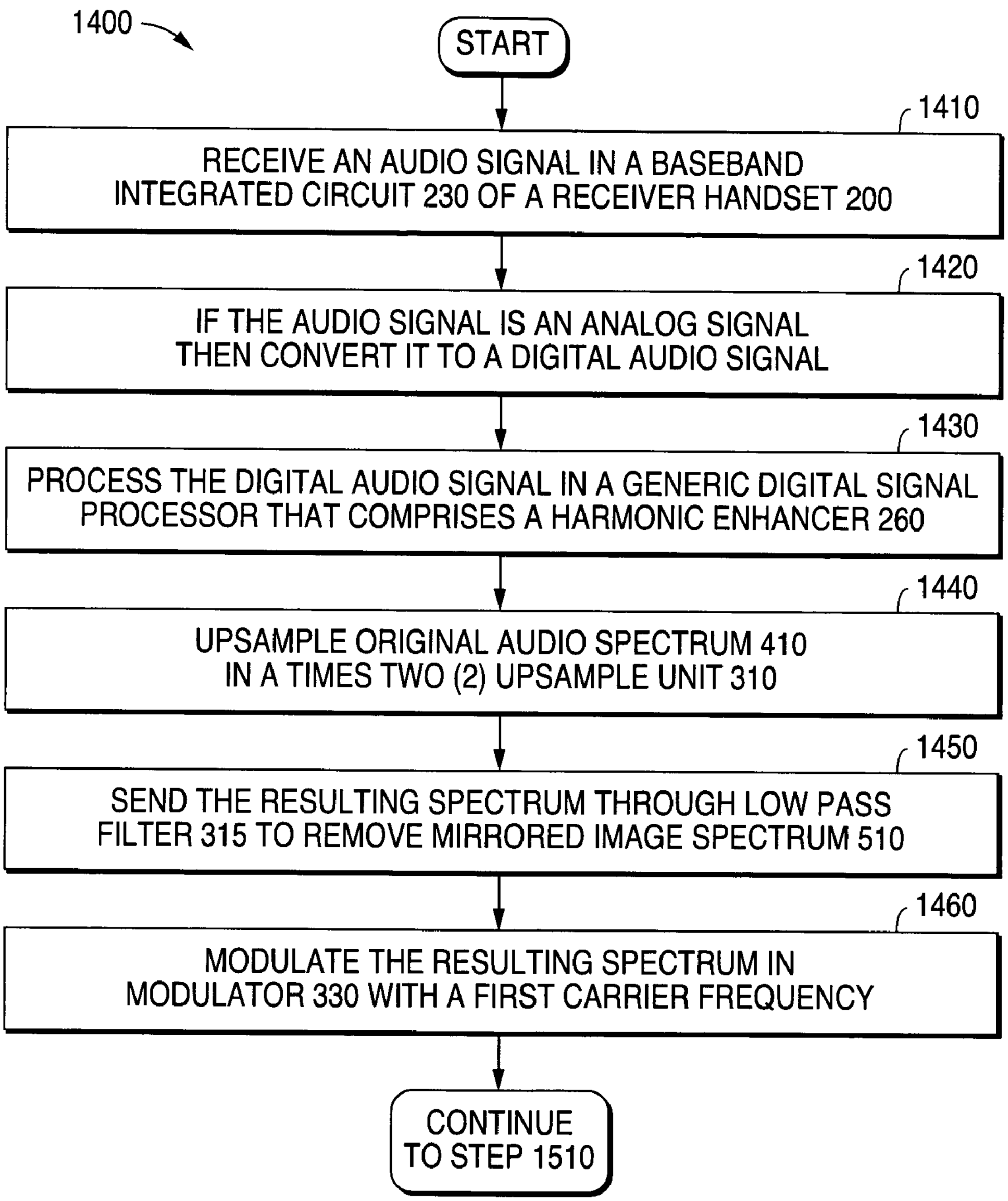
FIG. 14 illustrates a flow chart showing the steps of a first portion of an advantageous embodiment of the method of the present invention.

FIG. 14 illustrates a flow chart 1400 showing the steps of a first portion of an advantageous embodiment of the method of the present invention. In the first step an audio signal is received in the baseband integrated circuit 230 of a receiver handset 200 (step 1410). If the audio signal is an analog audio signal then the audio signal is converted to a digital audio signal (step 1420). The digital audio signal is then processed in a generic digital signal processor 250 that comprises a harmonic enhancer 260 of the present invention (step 1430).

In the harmonic enhancer 260 the original audio spectrum 410 is upsampled in a times two (2) upsample unit 310 (step 1440). This doubles the signal bandwidth (e.g., from four kiloHertz (4 kHz) to eight kiloHertz (8 kHz)) and creates an alias spectrum 510 of the original spectrum. The alias spectrum 510 is located in the higher frequencies of the spectrum (e.g., between four kiloHertz (4 kHz) and eight kiloHertz (8 kHz). The resulting spectrum is then sent through a low pass filter 315 to remove the alias spectrum 510 (step 1450). The resulting spectrum (e.g., the original audio spectrum 410 now in an eight kiloHertz (8 kHz) bandwidth) is modulated in modulator 330 with a first carrier frequency (e.g., two kiloHertz (2 kHz)) (step 1460). The method then proceeds to step 1510 of FIG. 15.

Figure 15:
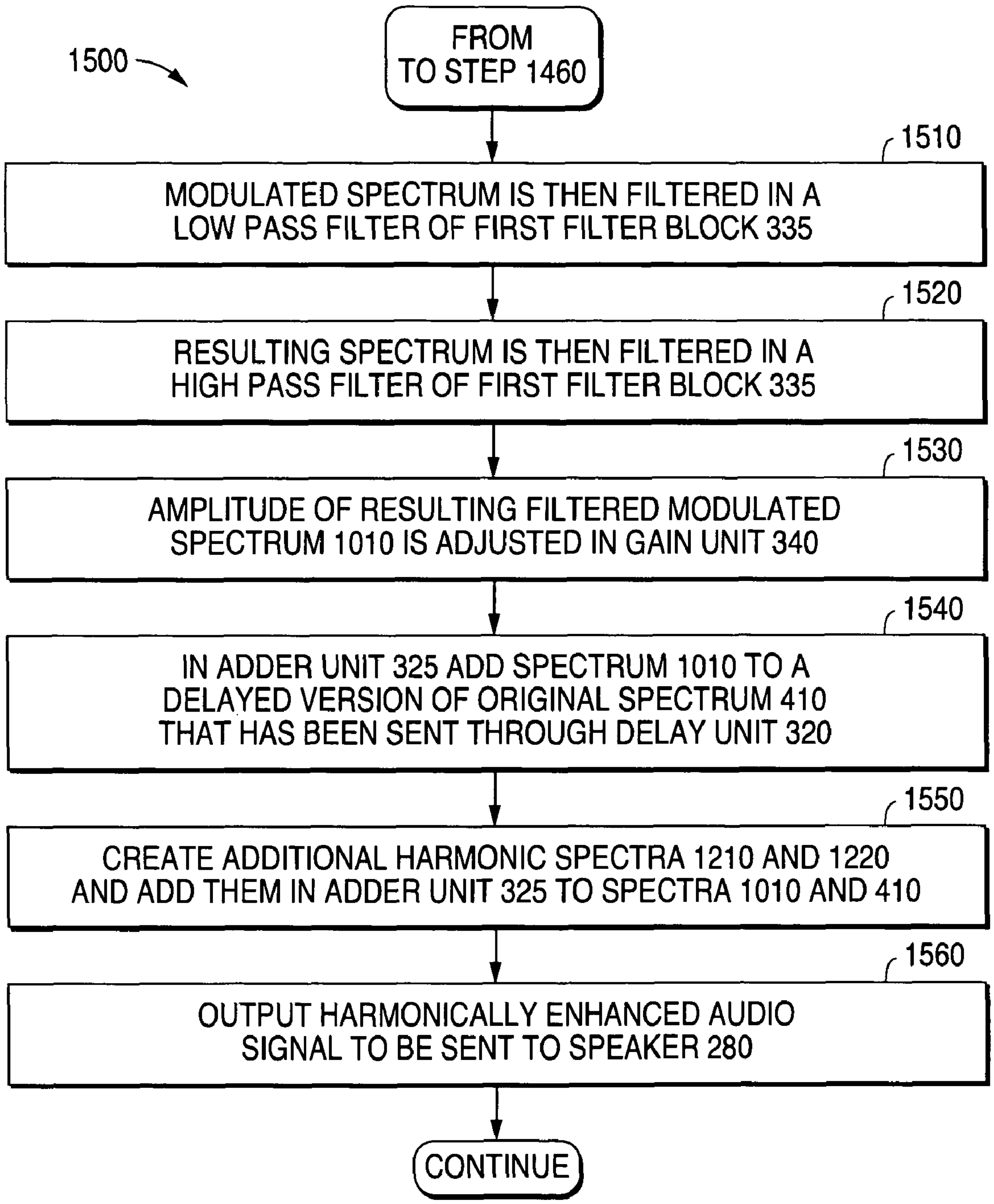
FIG. 15 illustrates a flow chart showing the steps of a second portion of an advantageous embodiment of the method of the present invention.

FIG. 15 illustrates a flow chart 1500 showing the steps of a second portion of an advantageous embodiment of the method of the present invention. The method proceeds from step 1460 of FIG. 14. The modulated spectrum from modulator 330 is then sent to first filter block 335 and filtered in a low pass filter (e.g., filter characteristic 810) to remove unwanted high frequency portions of the spectrum (step 1510). The resulting spectrum is then filtered in a high pass filter (e.g., filter characteristic 910 of first filter block 335 to remove unwanted low frequency portions of the spectrum (step 1520).

Then the resulting filtered modulated spectrum 1010 is sent to gain unit 340 and the amplitude of spectrum 1010 is adjusted (step 1530). Usually the amplitude of spectrum 1010 is reduced to create an attenuated version of spectrum 1010. After amplitude adjustment, the filtered modulated spectrum 1010 is sent to adder unit 325. Spectrum 1010 is then added to a delayed version of the original spectrum 410 that has been sent through delay unit 320 (step 1540).

At the same time that spectrum 1010 is created, a second spectrum 1210 is similarly created and using modulator 345, a second carrier frequency, second filter block 350 and gain unit 355. At the same time that spectrum 1010 and spectrum 1210 are created, a third spectrum 1220 is similarly created and using modulator 360, a third carrier frequency, third filter block 365 and gain unit 370. The creation of additional spectra and the addition of the additional spectra in adder unit 325 are designated with reference numeral 1550. The harmonically enhanced audio signal of the present invention is then output to be sent to speaker 280 (step 1560).

The addition of one harmonic spectrum (e.g., spectrum 1010) to the original audio spectrum (410) produces a sharper sound. The sound is further improved by repeating the modulation on different frequencies (i.e., adding spectrums 1210 and 1220). Modulated sounds have a rather sharp sound. The combined spectrum may be made closer to the original sounds by attenuating the modulated sounds. The addition of the modulated sounds to the original audio provides a subjective improvement to the audio quality. That is, not everyone may agree that the additions are enhancements to the original audio quality. For this reason, the receiving system 200 of the present invention is provided with a switch (not shown) that will selectively enable and disable the harmonic enhancer 260 as directed by the end user.

The generic digital signal processor (GenDSP) 250 in baseband integrated circuit 230 can perform the function of harmonic enhancer 260 in real time. For example, if baseband integrated circuit 230 is implemented by the SC14428 baseband chip, the SC14428 baseband chip is able to sample audio signals with a sixteen kiloHertz (16 kHz) frequency. With a sample frequency of sixteen kiloHertz (16 kHz), the ADPCM decoder 240 of the SC14428 baseband chip can process the eight kiloHertz (8 kHz) sampled data of the radio frequency (RF) interface by means of a software buffer (not shown). The SC14428 baseband chip can process a maximum effective audio band of one hundred Hertz (100 Hz) to six thousand eight hundred Hertz (6,800 Hz).

For best results, the parameters of the harmonic enhancer 260 should be adjusted to match the hardware (e.g., speaker circuitry) that produces the sound. For example, a speaker can reproduce certain frequencies harder or softer. This may cause the effect of the harmonic enhancer 260 to have less than the desired effect. This phenomenon occurs due to the acoustic properties of the speaker and the speaker-cabinet. This problem may be minimized by adjusting the parameters of the harmonic enhancer 260 using acoustic measurements taken of the speaker 280 in its final housing. The measurements of the speaker 280 are best performed in an acoustically "dead" room where there is no noise interference.

The harmonic enhancer 260 of the present invention may be used in any audio application in which digital audio signals are transmitted over a limited bandwidth. In one advantageous embodiment of the invention the received signal does not have to be a digital signal. The received signal may be an analog signal that is digitized before it is played for the receiving listener (i.e., a digital enhancement of the original analog signal).

The harmonic enhancer 260 of the present invention may be used in digital cordless telephone handsets. The digital cordless telephone handsets may be compliant with the Desktop Computer Telephone Integration (DCTI) standard, the Digital Enhanced Cordless Telecommunication (DECT) standard, the Personal Handyphone System (PHS) standard, and many other similar types of standards.

The harmonic enhancer 260 of the present invention may be used in digital cellphone telephone handsets. The digital cellphone telephone handsets may be compliant with the Global System for Mobile Communications (GSM) standard, the Code Division Multiple Access (CDMA) standard, the Universal Mobile Telecommunications System (UMTS) standard, and many other similar types of standards.

The harmonic enhancer 260 of the present invention may be used in digital satellite telephone handsets and other similar communications systems. In addition, the harmonic enhancer 260 of the present invention may be used in digital corded telephone handsets, digital speaker phones, digital intercom systems, and walkie talkie systems. The harmonic enhancer 260 of the present invention may also be used in digital "voice over Internet Protocol" (VoIP) systems and Internet telephony.

The harmonic enhancer 260 of the present invention may be used in any type of device that utilizes digitally stored voice playback, such as digital audio telephone answering machines, voicemail, automated audio response systems, digital memorandum recorders, and digital audio talking toys.

Although the present invention has been described with an exemplary embodiment, various changes and modifications may be suggested to one skilled in the art. It is intended that the present invention encompass such changes and modifications as fall within the scope of the appended claims.

What is claimed is:

1. A digital harmonic enhancer comprising:

a baseband integrated circuit configured to process digital audio signals and add frequency components created by combining amplitude information of said digital audio signals with a fixed carrier frequency to a digital audio signal, wherein said harmonic enhancer is configured to create at least one additional harmonic spectrum from an original spectrum of said digital audio signal, and configured to add said at least one additional harmonic spectrum to a delayed version of said original spectrum of said digital audio signal, and wherein said harmonic enhancer comprises:

an upsample unit configured to upsample said original spectrum of said digital audio signal to increase a bandwidth size for said original spectrum;

a low pass filter unit configured to low pass filter a resulting upsampled spectrum to remove an alias spectrum of said original spectrum;

a delay unit configured to create a delayed version of said low pass filtered original spectrum of said digital audio signal;

at least one branch configured to create said at least one additional harmonic spectrum from said low pass filtered original spectrum of said digital audio signal; and an adder unit configured to add said at least one additional harmonic spectrum to said delayed version of said low pass filtered original spectrum of said digital audio signal.

2. The harmonic enhancer as claimed in claim 1 wherein said at least one branch configured to create said at least one additional harmonic spectrum from said low pass filtered original spectrum of said digital audio signal comprises:

a modulator configured to modulate said low pass filtered original spectrum of said digital audio signal with a carrier frequency to create a modulated harmonic spectrum;

a filter block configured to filter said modulated harmonic spectrum with one of: (1) a high pass filter and a low pass filter, and (2) a band pass filter; and a gain unit coupled to an output of said filter block and configured to adjust an amplitude of said modulated harmonic spectrum.

3. The harmonic enhancer as claimed in claim 2 wherein said gain unit attenuates said amplitude of said modulated harmonic spectrum.

4. The harmonic enhancer as claimed in claim 1 wherein said original spectrum of said digital audio signal extends from approximately zero Hertz to approximately four kiloHertz; and said upsample unit increases an upper limit of bandwidth size of said original spectrum from approximately four kiloHertz to approximately eight kiloHertz.

5. The harmonic enhancer as claimed in claim 1 wherein said digital audio signal from which said harmonic enhancer creates at least one additional harmonic spectrum is in one of: a digital cordless telephone handset, a digital cellphone telephone handset, a digital satellite telephone handset, a digital corded telephone handset, a digital speaker phone, a digital intercom system, a walkie talkie telephone handset, a digital "voice over Internet Protocol" (VoIP) telephone handset, a digital audio telephone answering machine, a digital voicemail receiver, a digital automated audio response systems, a digital memorandum recorder, and a digital audio talking toy.

6. A digital audio signal receiver comprising:

a baseband integrated circuit capable of processing digital audio signals comprising a harmonic enhancer configured to add frequency components to a digital audio signal, wherein the frequency components are created by combining amplitude information of said digital audio signal with a fixed carrier frequency, wherein said harmonic enhancer comprises:

an upsample unit configured to upsample said original spectrum of said digital audio signal to increase a bandwidth size for said original spectrum;

a low pass filter unit configured to low pass filter a resulting upsampled spectrum to remove an alias spectrum of said original spectrum;

a delay unit configured to create a delayed version of said low pass filtered original spectrum of said digital audio signal;

at least one branch configured to create said at least one additional harmonic spectrum from said low pass filtered original spectrum of said digital audio signal; and an adder unit configured to add said at least one additional harmonic spectrum to said delayed version of said low pass filtered original spectrum of said digital audio signal.

7. The digital audio signal receiver as claimed in claim 6 wherein said harmonic enhancer is configured to create at least one additional harmonic spectrum from an original spectrum of said digital audio signal, and configured to add said at least one additional harmonic spectrum to a delayed version of said original spectrum of said digital audio signal.

8. The digital audio signal receiver as claimed in claim 7 wherein said at least one branch configured to create said at least one additional harmonic spectrum from said low pass filtered original spectrum of said digital audio signal comprises:

a modulator that is configured to modulate said low pass filtered original spectrum of said digital audio signal with a carrier frequency to create a modulated harmonic spectrum;

a filter block that is configured to filter said modulated harmonic spectrum with one of: (1) a high pass filter and a low pass filter, and (2) a band pass filter; and a gain unit that coupled to an output of said filter block wherein said gain unit is configured to adjust an amplitude of said modulated harmonic spectrum.

9. The digital audio signal receiver as claimed in claim 8 wherein said gain unit attenuates said amplitude of said modulated harmonic spectrum.

10. The digital audio signal receiver as claimed in claim 8 wherein said original spectrum of said digital audio signal extends from approximately zero Hertz to approximately four kiloHertz; and said upsample unit increases an upper limit of bandwidth size of said original spectrum from approximately four kiloHertz to approximately eight kiloHertz.

11. The digital audio signal receiver as claimed in claim 7 wherein said digital audio signal receiver is one of: a digital cordless telephone handset, a digital cellphone telephone handset, a digital satellite telephone handset, a digital corded telephone handset, a digital speaker phone, a digital intercom system, a walkie talkie telephone handset, a digital "voice over Internet Protocol" (VoIP) telephone handset, a digital audio telephone answering machine, a digital voicemail receiver, a digital automated audio response systems, a digital memorandum recorder, and a digital audio talking toy.

12. A method for enhancing voice quality of a digital audio signal, said method comprising the steps of:

providing said digital audio signal to a harmonic enhancer in a baseband integrated circuit of a digital audio signal receiver;

creating in said harmonic enhancer at least one additional harmonic spectrum from an original spectrum of said digital audio signal by combining amplitude information of said digital audio signal with a fixed carrier frequency; and adding said at least one additional harmonic spectrum to a delayed version of said original spectrum of said digital audio signal, wherein said step of creating in said harmonic enhancer at least one additional harmonic spectrum from an original spectrum of said digital audio signal comprises the steps of:

upsampling said original spectrum of said digital audio signal in an upsample unit to increase a bandwidth size for said original spectrum;

low pass filtering a resulting upsampled spectrum to remove an alias spectrum of said original spectrum;

modulating said low pass filtered spectrum in at least one modulator with a carrier frequency to create said at least one additional harmonic spectrum;

high pass filtering said at least one additional harmonic spectrum;

low pass filtering said at least one additional harmonic spectrum; and adjusting an amplitude of said at least one additional harmonic spectrum.

13. The method as claimed in claim 12 wherein said step of adjusting an amplitude of said at least one additional harmonic spectrum comprises the step of:

attenuating said amplitude of said at least one additional harmonic spectrum in a gain unit.

14. The method as claimed in claim 12 further comprising the steps of:

modulating said low pass filtered spectrum in each of a plurality of modulators where each modulator has different carrier frequency to create a plurality of additional harmonic spectra; and high pass filtering each of said plurality of additional harmonic spectra in a filter block unit;

low pass filtering each of said plurality of additional harmonic spectra in said filter block unit;

adjusting an amplitude of each of said plurality of additional harmonic spectra; and adding each of said additional harmonic spectra to a delayed version of said original spectrum of said digital audio signal.

15. The method as claimed in claim 14 wherein said step of adjusting an amplitude of each of said plurality of additional harmonic spectra comprises the step of:

attenuating said amplitude of each of said plurality of additional harmonic spectra in a plurality of gain units.

16. The method as claimed in claim 14 wherein:

said original spectrum of said digital audio signal extends from approximately zero Hertz to approximately four kiloHertz; and said upsample unit increases an upper limit of bandwidth size of said original spectrum from approximately four kiloHertz to approximately eight kiloHertz.

17. The method as claimed in claim 14 wherein:

said original spectrum of said digital audio signal extends from approximately zero Hertz to approximately four kilohertz.

18. The method as claimed in claim 14 wherein:

said upsample unit increases an upper limit of bandwidth size of said original spectrum from approximately four kiloHertz to approximately eight kiloHertz.

19. The method as claimed in claim 12 wherein:

said original spectrum of said digital audio signal extends from approximately zero Hertz to approximately four kiloHertz; and said upsample unit increases an upper limit of bandwidth size of said original spectrum from approximately four kiloHertz to approximately eight kiloHertz.

20. The method as claimed in claim 12 further comprising the step of:

extending a first telephone frequency band of said digital audio signal receiver wherein said first telephone frequency band is from approximately three hundred Hertz (300 Hz) to approximately three thousand four hundred Hertz (3,400 Hz) to a second telephone frequency band where said second telephone frequency band is from approximately ten Hertz (10 Hz) to approximately eight thousand Hertz (8,000 Hz).

* * * * *